United States Patent
Ma et al.

(10) Patent No.: US 9,977,147 B2
(45) Date of Patent: May 22, 2018

(54) OPTICAL MODULE, METHOD OF MAKING THE SAME AND ELECTRONIC DEVICE INCLUDING THE SAME

(71) Applicant: Advanced Semiconductor Engineering, Inc., Kaohsiung (TW)

(72) Inventors: Ruei-Bin Ma, Kaohsiung (TW); Ying-Chung Chen, Kaohsiung (TW); Lu-Ming Lai, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days. days.

(21) Appl. No.: 14/975,036

(22) Filed: Dec. 18, 2015

(65) Prior Publication Data

US 2016/0187530 A1     Jun. 30, 2016

(30) Foreign Application Priority Data

Dec. 25, 2014   (CN) .......................... 2014 1 0819580

(51) Int. Cl.
*H01L 31/16*     (2006.01)
*H01L 25/16*     (2006.01)
(Continued)

(52) U.S. Cl.
CPC .............. *G01V 8/12* (2013.01); *H01L 25/167* (2013.01); *H01L 31/167* (2013.01); *H01L 2224/48091* (2013.01); *H01L 2224/48145* (2013.01)

(58) Field of Classification Search
CPC ........ H01L 25/167; H01L 31/167; G01V 8/12
See application file for complete search history.

(56) References Cited

U.S. PATENT DOCUMENTS

2002/0006687 A1*  1/2002  Lam ................. H01L 27/14618
                                                            438/118
2006/0035415 A1*  2/2006  Wood ............... H01L 27/14618
                                                            438/125
(Continued)

FOREIGN PATENT DOCUMENTS

CN           2831049 Y      10/2006
CN         103635289 A       3/2014
WO        WO92/16021    *    2/1992

OTHER PUBLICATIONS

Office Action from corresponding Chinese Patent Application No. 201410819580.7, dated Feb. 27, 2018, 5 pages.
(Continued)

*Primary Examiner* — Matthew Reames
(74) *Attorney, Agent, or Firm* — Foley & Lardner LLP; Cliff Z. Liu

(57) ABSTRACT

An optical module includes a carrier, a light-emitting component disposed over the carrier, an optical sensor disposed over the carrier, a housing, and a lens. The housing is disposed over the carrier and encircles the light-emitting component and the optical sensor. The housing defines a first accommodation space including a first aperture and a second aperture below the first aperture. The housing includes a first sidewall surrounding the first aperture, a second sidewall surrounding the second aperture, and a first support portion where a bottom end of the first sidewall and a top end of the second sidewall meet. The lens is located in the first aperture and is supported by the first support portion. One of the light-emitting component or the optical sensor is located in the first accommodation space.

24 Claims, 10 Drawing Sheets

(51) Int. Cl.
    *G01V 8/12*     (2006.01)
    *H01L 31/167*     (2006.01)

(56) References Cited

U.S. PATENT DOCUMENTS

| | | | |
|---|---|---|---|
| 2011/0240801 A1* | 10/2011 | Manzoni | B64G 1/1021 |
| | | | 244/171.1 |
| 2011/0316108 A1* | 12/2011 | Nihei | H01L 27/14618 |
| | | | 257/435 |
| 2013/0267273 A1* | 10/2013 | Rudmann | G01S 17/026 |
| | | | 455/556.1 |
| 2014/0347750 A1 | 11/2014 | Yamashita et al. | |
| 2015/0279827 A1* | 10/2015 | Tu | H01L 31/02325 |
| | | | 257/81 |

OTHER PUBLICATIONS

Search Report from corresponding Chinese Patent Application No. 201410819580.7, dated Feb. 27, 2018, 5 pages.

\* cited by examiner

OPTICAL MODULE, METHOD OF MAKING THE SAME AND ELECTRONIC DEVICE INCLUDING THE SAME

CROSS-REFERENCE TO RELATED PATENT APPLICATIONS

This application claims the benefit of P.R.C. (China) Patent Application No. 201410819580.7 filed on 25 Dec. 2014, the contents of which are incorporated herein by reference in their entirety.

BACKGROUND

1. Field

The present disclosure relates to an optical module, a method of making the same and an electronic device including the same.

2. Description of the Related Art

An optical module may, for example, be used as a proximity sensor of a mobile electronic device, such as a smartphone, and can be used to sense objects in the proximity of the optical module. The optical module may have a light-emitting component and an optical sensor, wherein the optical sensor can receive or sense light emitted by the light-emitting component and reflected by a nearby object (e.g., a human face surface of a user of a smartphone), to sense proximity of the nearby object, thereby facilitating the mobile electronic devices to carry out an automatic screen turn-off action.

When optical components such as a light-emitting component and an optical sensor are fixed to a substrate of the optical module, it is likely that alignment is not relatively accurate. For example, when a die bonder fixes a die onto the substrate, it is likely to produce a shift (placement error) of approximately 10 micrometers (μm) or more. The shift can cause the light-emitting component and the optical sensor to be misaligned on a designed optical path, thereby affecting operation performance of the optical module.

In addition, a transparent packaging material can be used to clad the light-emitting component and the optical sensor to achieve a protection effect, and a transparent packaging material in a predetermined shape can be further formed above the light-emitting component and/or the optical sensor to form a lens, to achieve a light-gathering or light guiding effect. However, a molding technology that may be used to perform a process of forming a lens from a transparent packaging material may cause errors in a size of a mold cavity or errors in the size and position of the lens, caused by accumulation of mechanical errors of mold alignment. Such errors can affect operation of the optical module, such as low coaxiality between a lens center and a lighting source, which can directly cause reduction of luminous efficiency. Additionally, a cost of using a transparent packaging material to form a lens and a mold increases when there is a diversity of specifications such as size or custom requirements of the optical module.

Further, positioning holes on the substrate of the optical module have certain manufacturing tolerances, such that if a housing that isolates the light-emitting component and the optical sensor is fixed onto the substrate, a corresponding error will be produced, which may cause reduction of predetermined cross talk prevention capability of the housing.

SUMMARY

An optical module includes a carrier, a light-emitting component disposed over the carrier, an optical sensor disposed over the carrier, a housing, and a lens. The housing is disposed over the carrier and encircles the light-emitting component and the optical sensor. The housing defines a first accommodation space including a first aperture and a second aperture below the first aperture. The housing includes a first sidewall surrounding the first aperture, a second sidewall surrounding the second aperture, and a first support portion where a bottom end of the first sidewall and a top end of the second sidewall meet. The lens is located in the first aperture and is supported by the first support portion. One of the light-emitting component or the optical sensor is located in the first accommodation space.

A method of making an optical module includes (a) providing a substrate; (b) disposing a light-emitting component and an optical sensor over the substrate; (c) disposing a housing over the substrate, the housing defining a first accommodation space and a second accommodation space, the housing encircling the light-emitting component and the optical sensor and (d) positioning a first lens into a first aperture, supported by a first support portion, and positioning a second lens into a third aperture, supported by a second support portion. The first accommodation space includes the first aperture and a second aperture below the first aperture, the first aperture has a first aperture size, the second aperture has a second aperture size, and the first aperture size greater than the second aperture size. The housing includes a first sidewall surrounding the first aperture; a second sidewall surrounding the second aperture; and the first support portion where a bottom end of the first sidewall and a top end of the second sidewall meet. The second accommodation space includes the third aperture and a fourth aperture below the third aperture, the third aperture having a third aperture size, the fourth aperture having a fourth aperture size, and the third aperture size greater than the fourth aperture size. The second accommodation space further includes a third sidewall surrounding the third aperture; a fourth sidewall surrounding the fourth aperture; and the second support portion where a bottom end of the third sidewall and a top end of the fourth sidewall meet.

An electronic device includes an optical module. The optical module includes a carrier; a light-emitting component disposed over the carrier; an optical sensor disposed over the carrier; and a housing. The housing is disposed over the carrier and encircles the light-emitting component and the optical sensor. The housing defines a first accommodation space including a first aperture and a second aperture below the first aperture, the first aperture has a first aperture size, and the second aperture has a second aperture size. The housing includes a first sidewall surrounding the first aperture; a second sidewall surrounding the second aperture; and a first support portion where a bottom end of the first sidewall meets a top end of the second sidewall. The housing further includes a first lens positioned in the first aperture and supported by the first support portion. One of the light-emitting component or the optical sensor is disposed in the first accommodation space.

DETAILED DESCRIPTION

In the following, spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
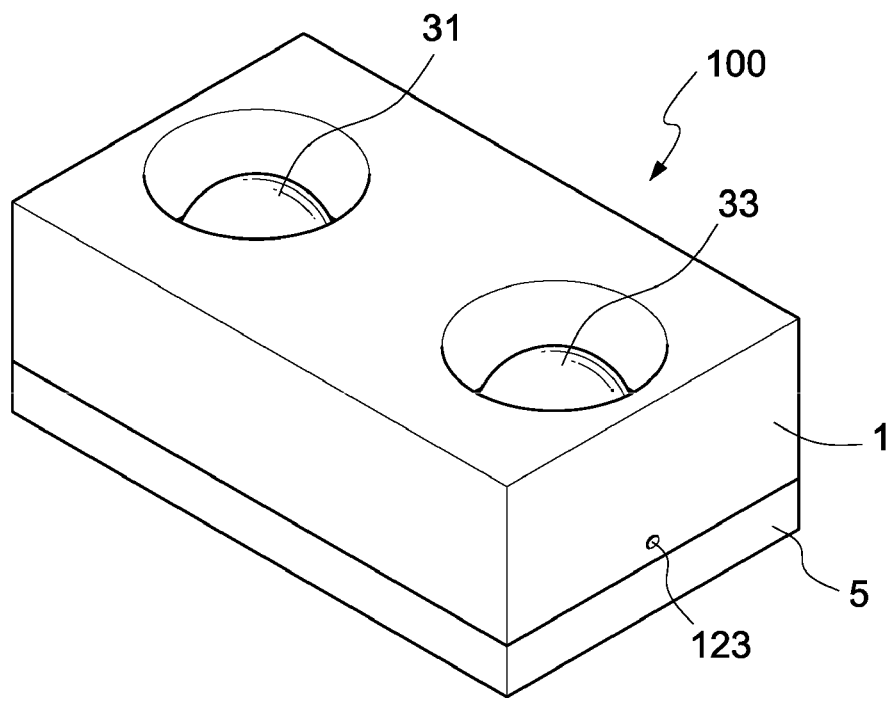
FIG. 1 is a schematic view of an optical module according to an embodiment of the present disclosure.

FIG. 1 is a schematic view of an optical module according to an embodiment of the present disclosure, by way of introduction. The optical module 100 includes a housing 1, a substrate 5, a first lens 31 and a second lens 33.

The optical module 100 may be, but is not limited to, a proximity sensor, which can be applied to, but is not limited to, electronic products such as mobile phones, digital cameras and tablet computers.

Figure 2A:
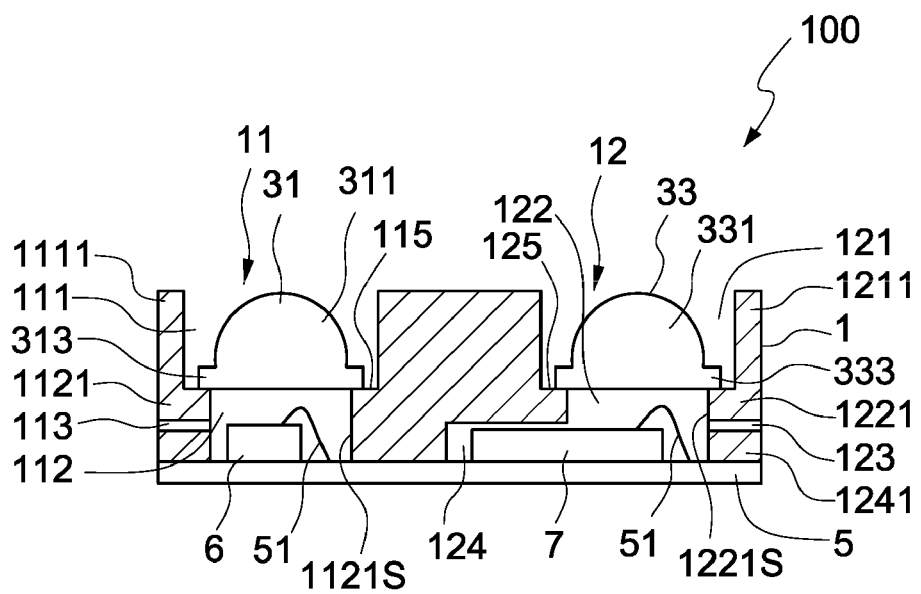
FIG. 2A is a schematic sectional view of an optical module according to an embodiment of the present disclosure.

FIG. 2A is a schematic sectional view of the optical module 100 of FIG. 1 according to an embodiment of the present disclosure. In FIG. 2A, the optical module 100 includes the housing 1, the substrate 5, a light-emitting component 6, an optical sensor 7, the first lens 31 and the second lens 33.

The substrate 5 may be or may include, but is not limited to, carriers or printed circuit boards. A trace, a wire bond pad and/or a via may be included in the substrate 5 or on a surface thereof. The substrate 5 may be made of a material known by persons skilled in the art that can serve as a substrate.

The light-emitting component 6 may be, but is not limited to, a light emitting diode (LED).

The optical sensor 7 may be, but is not limited to, a photodiode.

In one or more embodiments, a conductive or non-conductive adhesive (not shown) is used to fix the light-emitting component 6 and the optical sensor 7 to an upper surface of the substrate 5. In one or more embodiments, such as shown in FIG. 2A, one or more bonding wires 51 electrically connect one or both of the light-emitting component 6 and the optical sensor 7 to wire bond pads (not shown) located on the upper surface of the substrate 5. In other embodiments, the light-emitting component 6 and the optical sensor 7 are fixed to the upper surface of the substrate 5 using a flip-chip technology.

The housing 1 is disposed above the substrate 5 or at the upper surface of the substrate 5. The housing 1 defines a first accommodation space 11 and a second accommodation space 12.

The first accommodation space 11 includes a first aperture 111 and a second aperture 112. The first aperture 111 is above the second aperture 112.

A first sidewall 1111 surrounds or defines the first aperture 111. The first aperture 111 has a first aperture size (e.g., diameter).

A second sidewall 1121 surrounds or defines the second aperture 112. The second aperture 112 has a second aperture size (e.g., diameter). The light-emitting component 6 is positioned within the second aperture 112.

The first aperture size is greater the second aperture size, for example, at least approximately 1.05 times, 1.1 times, 1.2 times, or 1.3 times greater.

A bottom end of the first sidewall 1111 surrounding the first aperture 111 and a top end of the second sidewall 1121 surrounding the second aperture 112 meet at a first support portion 115 therebetween.

The second sidewall 1121 of the housing 1 further surrounds or defines a first vent hole 113. The first vent hole 113 laterally communicates (in the orientation shown) with the second aperture 112 and an exterior of the housing 1. In other words, fluid such as gas or liquid (not shown) may flow to the exterior of the housing 1 from the second aperture 112 by way of the first vent hole 113, and vice versa.

The second accommodation space 12 includes a third aperture 121, a fourth aperture 122 and a fifth aperture 124. The fourth aperture 122 is above the fifth aperture 124. The third aperture 121 is above the fourth aperture 122. A third sidewall 1211 surrounds or defines the third aperture 121. The third aperture 121 has a third aperture size (e.g., diameter).

A fourth sidewall 1221 surrounds or defines the fourth aperture 122. The fourth aperture 122 has a fourth aperture size (e.g., diameter).

A fifth sidewall 1241 surrounds or defines the fifth aperture 124. The fifth aperture 124 has a fifth aperture size (e.g., diameter). The optical sensor 7 is positioned within the fifth aperture 124.

The third aperture size is greater than the fourth aperture size, for example, at least approximately 1.05 times, 1.1 times, 1.2 times, or 1.3 times greater. A bottom end of the third sidewall 1211 surrounding the third aperture 121 and a top end of the fourth sidewall 1221 surrounding the fourth aperture 122 meet a second support portion 125 therebetween.

The fifth aperture size is greater than the fourth aperture size, for example, at least approximately 1.05 times, 1.1 times, 1.2 times, or 1.3 times greater.

The fourth sidewall 1221 and/or the fifth sidewall 1241 of the housing 1 may further surround or define a second vent hole 123. The second vent hole 123 laterally communicates with the fourth aperture 122 and/or the fifth aperture 124 and an exterior of the housing 1. In other words, fluid such as gas or liquid (not shown) may flow to the exterior of the housing 1 from the fourth aperture 122 and/or the fifth aperture 124 by way of the second vent hole 123, and vice versa.

When the housing 1 is disposed over the substrate 5, the light-emitting component 6 and the optical sensor 7 are encircled by the housing 1. The housing 1 is positioned such that the light-emitting component 6 is located in the second aperture 112 of the first accommodation space 11 and the optical sensor 7 is located in the fifth aperture 124 of the second accommodation space 12.

The first lens 31 is located in the first aperture 111 of the first accommodation space 11 and is supported by the first support portion 115. The first aperture size of the first aperture 111 is greater than a diameter of a bottom portion 313 of the first lens 31. Therefore, when the first lens 31 is supported on the first support portion 115, there is a gap between the bottom portion 313 of the first lens 31 and the first sidewall 1111.

When the first lens 31 is disposed on the first support portion 115, a center line or center point of a lens portion 311 of the first lens 31 is aligned with a geometric center of a light-emitting area of the light-emitting component 6, to improve the luminous efficiency of the optical module 100. Although the light-emitting component 6 has been fixed onto the substrate 5, an alignment action can still be carried out by adjusting a lateral positioning of the first lens 31. The gap between the bottom portion 313 of the first lens 31 and the first sidewall 1111 is available for adjusting the lateral positioning of the first lens 31.

The second aperture size of the second aperture 112 is greater than a diameter of the lens portion 311 of the first lens 31, and thus, in the event that the first lens 31 is appropriately disposed in the first aperture 111, light emitted by the light-emitting component 6 located below the first lens 31 can be substantially completely provided through the lens portion 311, thereby further increasing luminous efficiency.

The second lens 33 is located in the third aperture 121 of the second accommodation space 12 and is supported by the second support portion 125. The third aperture size of the third aperture 121 is greater than a diameter of a bottom portion 333 of the second lens 33.

Therefore, when the second lens 33 is supported on the second support portion 125, there is a gap between the bottom portion 333 of the second lens 33 and the third sidewall 1211.

When the second lens 33 is disposed on the second support portion 125, a center line or center point of a lens portion 331 of the second lens 33 is aligned with a geometric center of a light-emitting area of the optical sensor 7, so that all or substantially all light entering the third aperture 121 can reach a photosensitive area of the optical sensor 7, to improve light receiving and sensing efficiency. Although the optical sensor 7 has been fixed onto the substrate 5, an alignment action can still be carried out by adjusting a lateral positioning of the second lens 33. The gap between the bottom portion 333 of the second lens 33 and the third sidewall 1211 is available for adjusting the lateral positioning of the second lens 33.

The fourth aperture size of the fourth aperture 122 is greater than a diameter of the lens portion 331 of the second lens 33, and thus, in the event that the second lens 33 is appropriately disposed in the third aperture 121, the optical sensor 7 located below the second lens 33 can substantially completely receive light transmitted through the lens portion 331, thereby further increasing light receiving and sensing efficiency.

As the housing 1 has the first support portion 115 and the second support portion 125 which can bear the first lens 31 and the second lens 33 respectively, after the first lens 31 and the second lens 33 are respectively fixed to the first support portion 115 and the second support portion 125, it may be unnecessary to use a packaging material to clad the light-emitting component 6 and the optical sensor 7, due to protection provided by the first lens 31 and the second lens 33 thereabove. It may also be unnecessary to use a general molding technology to perform a molding of a lens from a transparent packaging material, which also reduces manufacturing tolerances and errors, as well as reducing costs of packaging, molding and the like.

In the embodiment of FIG. 2A, after the first lens 31 and the second lens 33 are respectively fixed to the first support portion 115 and the second support portion 125, a packaging material may be omitted between the first lens 31 and the light-emitting component 6 or between the second lens 33 and the optical sensor 7. Thus air, but not packaging material, may exist in the second aperture 112, the fourth aperture 122 and the fifth aperture 124.

The optical module 100 may be mounted to a system substrate or a printed circuit board (not shown) in a subsequent stage or process. Mounting of the optical module 100 may be performed in a high temperature environment, for example, the temperature may be up to approximately 250° C. during reflow. After the first lens 31 and the second lens 33 are respectively fixed to the first support portion 115 and the second support portion 125, if passing through the high temperature environment, the air in the second aperture 112, the fourth aperture 122 and the fifth aperture 124 if not released could, due to heating expansion, separate the first lens 31 and the second lens 33 respectively from the first support portion 115 and the second support portion 125. The first vent hole 113 and the second vent hole 123 allow the air in the second aperture 112, the fourth aperture 122 and the fifth aperture 124 to be released to the exterior of the optical module 100, thereby avoiding separation of one or both of the first lens 31 and the second lens 33 from the housing 1.

Figure 2B:
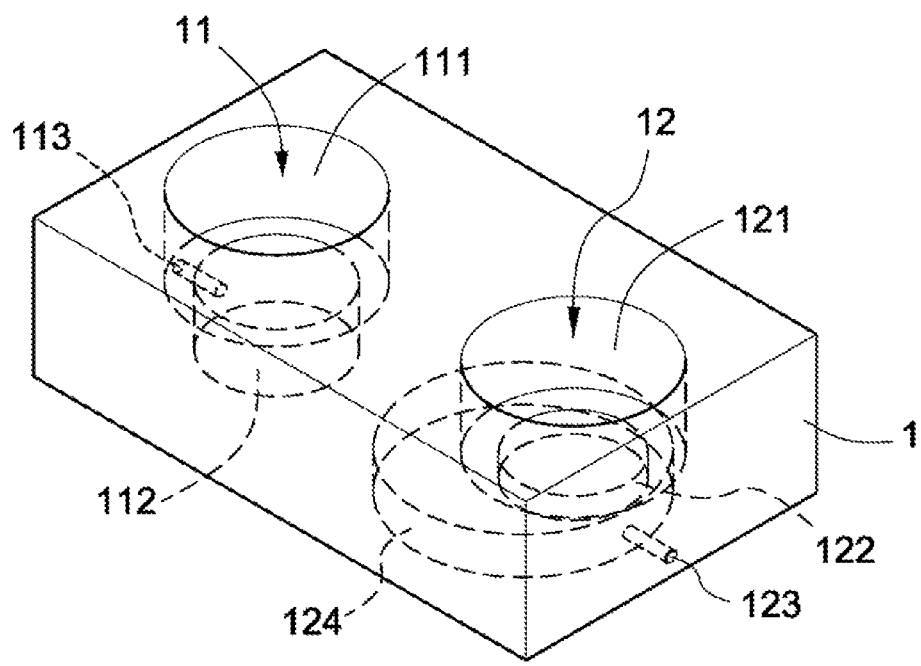
FIG. 2B is a three-dimensional perspective view of a housing according to an embodiment of the present disclosure.
Figure 2C:
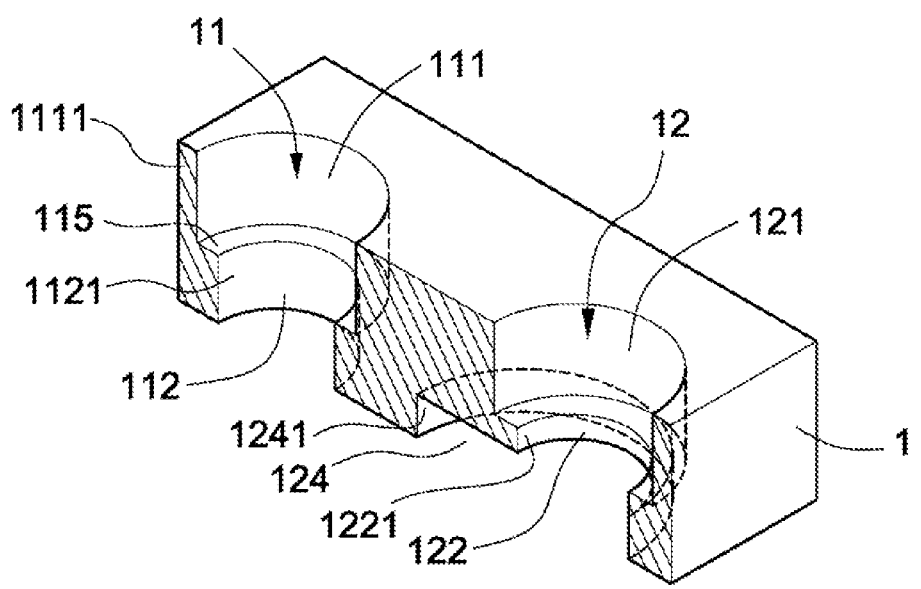
FIG. 2C is a sectional three-dimensional perspective view of a housing according to an embodiment of the present disclosure.

FIG. 2B is a three-dimensional perspective view of the housing 1 of FIG. 2A according to an embodiment of the present disclosure. FIG. 2C is a sectional three-dimensional perspective view of the housing 1 of FIG. 2B according to an embodiment of the present disclosure. Referring to FIG. 2B and FIG. 2C, the housing 1 defines the first accommodation space 11 and the second accommodation space 12, where the first accommodation space 11 includes the first aperture 111 vertically superimposed above the second aperture 112, and the second accommodation space 12 includes the third aperture 121, the fourth aperture 122 and the fifth aperture 124 vertically superimposed as shown.

In FIGS. 2B and 2C, the relative sizes of the apertures are shown, where the first aperture size of the first aperture 111 is greater than the second aperture size of the second aperture 112, the third aperture size of the third aperture 121 is greater than the fourth aperture size of the fourth aperture 122, and the fifth aperture size of the fifth aperture 124 is greater than the fourth aperture size of the fourth aperture 122.

In addition, the first accommodation space 11 of the housing 1 may communicate with the first vent hole 113 and the second accommodation space 12 of the housing 1 may communicate with the second vent hole 123.

The housing 1 as in FIGS. 2B and 2C may be obtained by, for example but not limited to, a mechanical manufacturing technique such as plastic injection molding.

FIGS. 3A to 3E are schematic views of a method of making the optical module 100 of FIGS. 1, 2A and 2B according to an embodiment of the present disclosure.

Figure 3A:
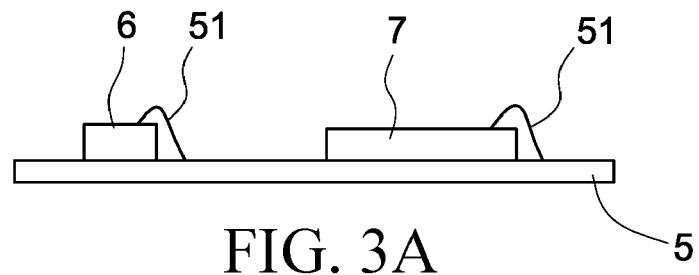
FIG. 3A, FIG. 3B, FIG. 3C, FIG. 3D, and FIG. 3E are schematic views of a method of making an optical module according to an embodiment of the present disclosure.

Referring to FIG. 3A, a light-emitting component 6 and an optical sensor 7 are sequentially or substantially concurrently fixed onto a surface of a substrate 5. In one or more embodiments, bonding wires 51 can be used to respectively electrically connect the light-emitting component 6 and the optical sensor 7 to a wire bond pad (not shown) located on the surface of the substrate 5. In other embodiments, the light-emitting component 6 and the optical sensor 7 may be flip-chip dies, and thus the light-emitting component 6 and the optical sensor 7 can be fixed onto the substrate 5 without the wire 51 by using, for example, solder in a flip-chip technique.

For positioning and alignment of the light-emitting component 6 and the optical sensor 7, markings may be used. For example, a circuit pattern (e.g., lines intersecting to form right angles or crosses) or other fiducial marks may be used along with an optical identification and positioning system including a charge coupled device (CCD) lens, to carry out an optical identification, alignment and positioning action, so as to relatively accurately position the light-emitting component 6 and the optical sensor 7 to predetermined positions on the substrate 5.

Figure 3B:
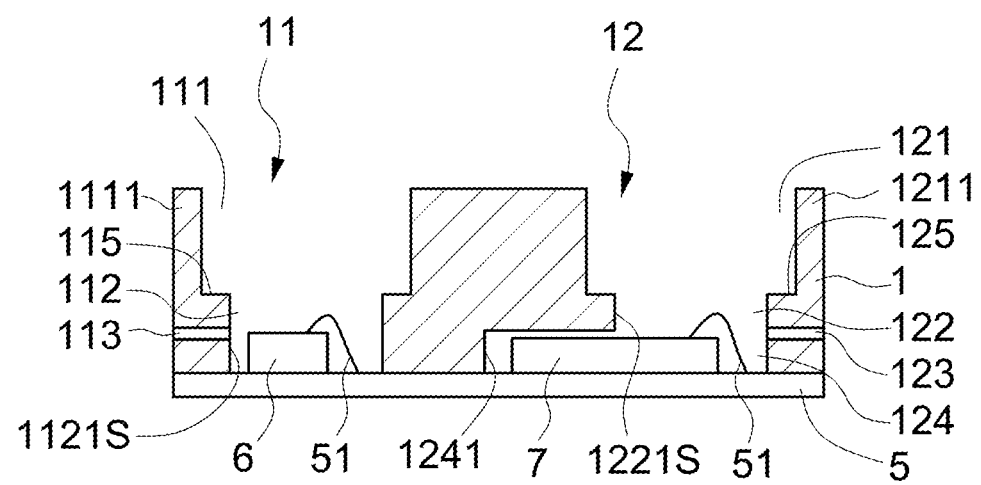

Referring to FIG. 3B, the housing 1 is fixed to a predetermined position on the substrate 5, so that the housing 1 can simultaneously encircle the light-emitting component 6 and the optical sensor 7. The same or additional fiducial marks may be used to relatively accurately position the housing 1. Additional fiducial marks include, for example, pads, other circuit patterns, or marks on the substrate 5. Further, alignment marks may be included on components or wall surfaces such as a surface 1121S of the second sidewall 1121 or a surface 1221S of the fourth sidewall 1221. In one or more embodiments, the housing 1 includes a positioning design in which four sides protrude (not shown), to reduce shifting of the housing 1 during adherence to the substrate 5 due to mobility of an adhesive or in a process of baking and curing the adhesive. The housings 1 may be positioned using a pick-and-place technique. In one or more embodiments, individual housings 1 are positioned one at a time on the substrate 5. In other embodiments, multiple housings 1 are positioned on the substrate 5 in a connected matrix of the housings 1, and the matrix is positioned using suitable positioning holes (mechanical or optical) or a positioning jig.

After the housing 1 is fixed onto the substrate 5, the light-emitting component 6 is located in the second aperture 112 of the first accommodation space 11 of the housing 1, and the optical sensor 7 is located in the fifth aperture 124 of the second accommodation space 12.

Figure 3C:
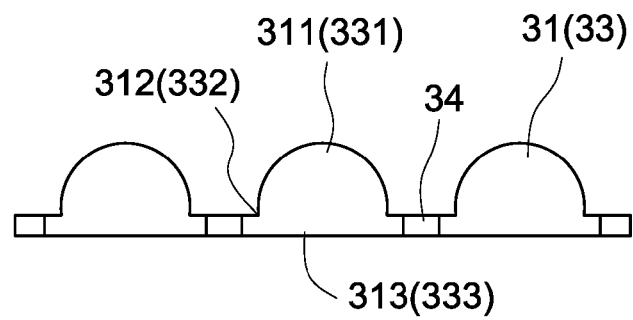

Referring to FIG. 3C, a lens array is shown. The lens array may include, but is not limited to, multiple lenses 31 (or multiple lenses 33, or multiple lenses 31 alternating with multiple lenses 33) and a connecting portion 34. The connecting portion 34 connects each lens 31 (or 33) to an adjacent lens 31 (or 33). A lens portion 311 (or 331) is in a spherical shape and presents a step-like structure in profile with an adjacent portion 312 (or 332) of a flow channel formed by using a die forming lens process. That is, a lens bottom portion 313 (or 333), when viewed from above, will present a high-brightness light ring, a circumferential center of the light ring is a geometric center line of the lens 31 (or 33), which can serve as an alignable mark of optical identification when the lens 31 (or 33) is subsequently fixed to the housing 1.

Figure 3D:
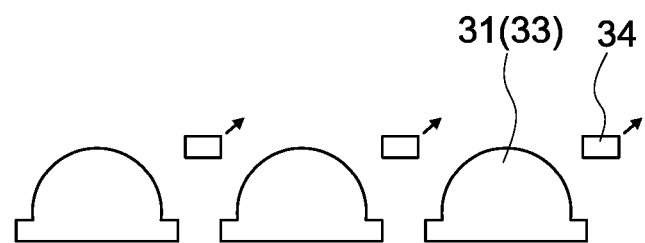

Referring to FIG. 3D, the connecting portion 34 is removed, for example, by cutting, to divide the lens array into multiple individual first lenses 31 and/or multiple individual second lenses 33 separated from each other.

Figure 3E:
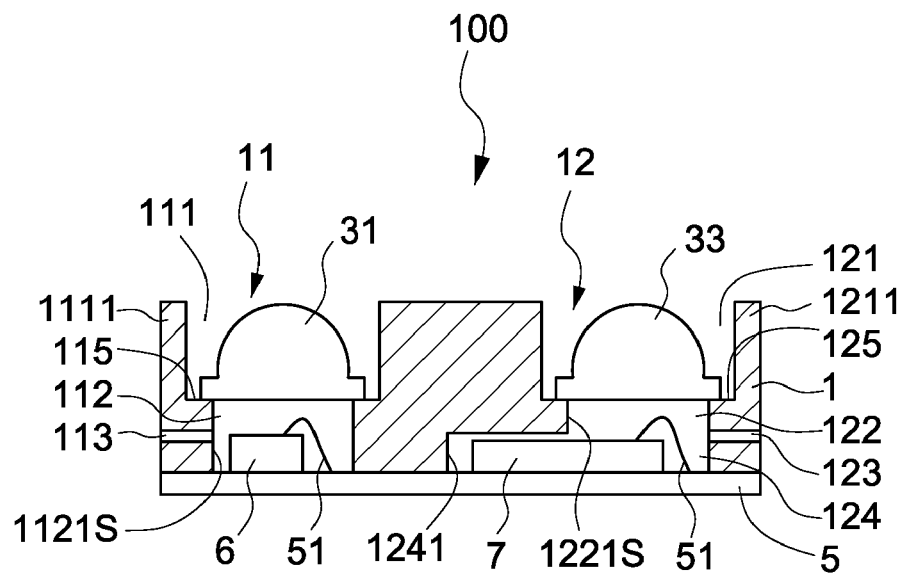

Referring to FIG. 3E, the first lens 31 and the second lens 33 are respectively fixed onto the first support portion 115 and the second support portion 125 of the housing 1. An optical positioning system may be used, for example, to take the adjacent portion 312 (or 332) of the lens portion 311 (or 331) as an optical alignable mark, and use a pick and place machine to identify and capture the lens 31 (or 33), and place the first lens 31 and the second lens 33 respectively on the first support portion 115 and the second support portion 125 of the housing 1.

Other optical alignment marks for positioning the first lens 31 and the second lens 33 include the inner walls 1121s of the second sidewall 1121 (or edges thereof) the inner walls 1221s of the fourth sidewall 1221 (or edges thereof), a pad on the surface of the substrate, a pad of the light-emitting component 6, a pad of the optical sensor 7, a circuit pattern or other fiducial marks. The light-emitting component 6 or the optical sensor 7 may be formed via a patterning process such as semiconductor lithography, hence, the pad on the surface thereof, the circuit pattern or other fiducial mark patterns may have higher precision in position and size compared with the identifiable outline patterns formed through a mechanical machining process on the housing 1.

The first aperture size of the first aperture 111 of the first accommodation space 11 is greater than a diameter of the lens bottom portion 313 of the first lens 31, so that there is a first gap between the first lens 31 and the first sidewall 1111. As the size of the third aperture size of the third aperture 121 of the second accommodation space 12 is greater than a diameter of the lens bottom portion 333 of the second lens 33, there is a second gap between the second lens 33 and the third sidewall 1211. While the first lens 31 is being affixed, the first lens 31 can move within the first gap to perform or complete positioning alignment. While the second lens 33 is being affixed, the second lens 33 can move within the second gap to perform or complete positioning alignment.

In one or more embodiments, to reduce an error in alignment positioning, an ultraviolet (UV) curable gel, a sticky film or a high-viscosity sticky gel is used to affix the first lenses 31 and the second lenses 33 to the housing 1, to avoid a shift of the first lens 31 or the second lens 33 during hardening and baking of adhesive materials, or while being moved about.

Figure 4:
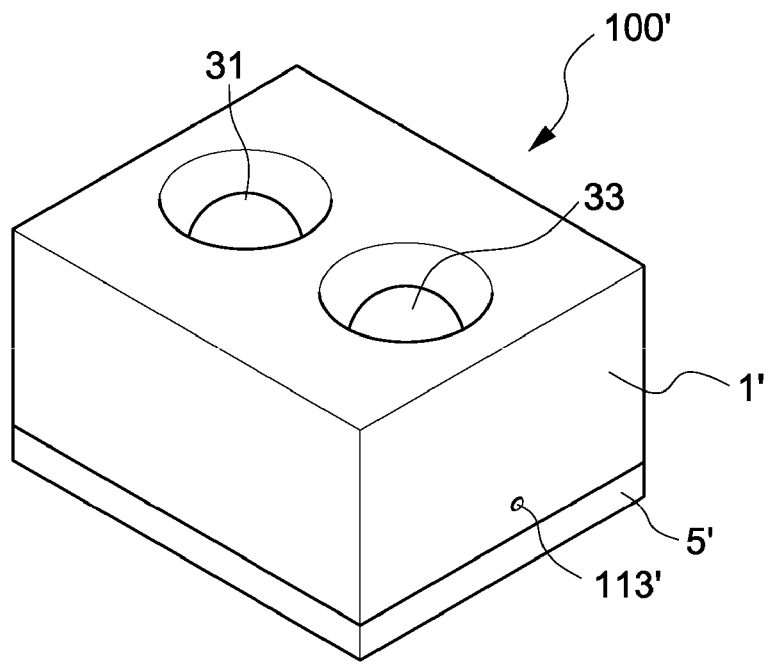
FIG. 4 is a schematic view of an optical module according to another embodiment of the present disclosure.

FIG. 4 is a schematic view of an optical module according to another embodiment of the present disclosure. The optical module 100' shown in FIG. 4 includes a housing 1', a substrate 5', a first lens 31 and a second lens 33.

The optical module 100' may be used in, but is not limited to, electronic products such as mobile phones, digital cameras and tablet computers.

Figure 5A:
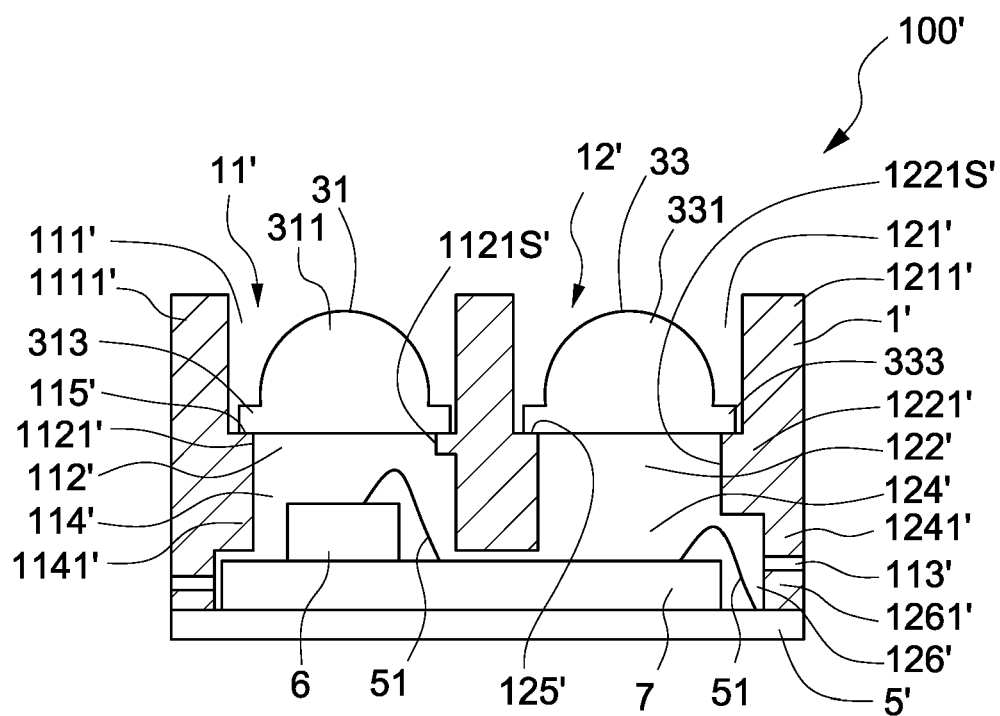
FIG. 5A is a schematic sectional view of an optical module according to another embodiment of the present disclosure.

FIG. 5A is a schematic sectional view of the optical module 100' according to an embodiment of the present disclosure. In FIG. 5A, the optical module 100' includes the housing 1', the substrate 5', a light-emitting component 6, an optical sensor 7, the first lens 31 and the second lens 33.

The substrate 5' may be or may include, but is not limited to, carriers or printed circuit boards. A trace, a wire bond pad and/or a via may be included in the substrate 5' or on a surface thereof. The substrate 5' may be made of a material known by persons skilled in the art that can serve as a substrate.

The light-emitting component 6 may be, but is not limited to, an LED.

The optical sensor 7 may be, but is not limited to, a photodiode. The light-emitting component 6 is disposed over an upper surface of the optical sensor 7.

A conductive or non-conductive adhesive (not shown) may be used to fix the optical sensor 7 to an upper surface of the substrate 5' and to fix the light-emitting component 6 to the upper surface of the optical sensor 7. In one or more embodiments, one or more bonding wires 51 electrically connect the optical sensor 7 to a wire bond pad (not shown) located on the upper surface of the substrate 5', or to electrically connect the light-emitting component 6 to a wire bond pad (not shown) located on the upper surface of the optical sensor 7. In other embodiments, a flip-chip technique is used to fix the optical sensor 7 to the upper surface of the substrate 5', and fix the light-emitting component 6 to the upper surface of the optical sensor 7.

The housing 1' is disposed above the substrate 5' or at the upper surface of the substrate 5'. The housing 1' defines a first accommodation space 11' and a second accommodation space 12'.

The first accommodation space 11' includes a first aperture 111', a second aperture 112' and a sixth aperture 114'. The second aperture 112' is above the sixth aperture 114'. The first aperture 111' is above the second aperture 112'.

A first sidewall 1111' surrounds or defines the first aperture 111'. The first aperture 111' has a first aperture size (e.g., diameter).

A second sidewall 1121' surrounds or defines the second aperture 112'. The second aperture 112' has a second aperture size (e.g., diameter).

A sixth sidewall 1141' surrounds or defines the sixth aperture 114'. The sixth aperture 114' has a sixth aperture size (e.g., diameter). The light-emitting component 6 is positioned within the sixth aperture 114'.

The first aperture size is greater than the second aperture size, for example, at least approximately 1.05 times, 1.1 times, 1.2 times, or 1.3 times greater. The sixth aperture size is greater than the second aperture size, for example, at least approximately 1.05 times, 1.1 times, 1.2 times, or 1.3 times greater.

A bottom end of the first sidewall 1111' surrounding the first aperture 111' and a top end of the second sidewall 1121' surrounding the second aperture 112' meet at a first support portion 115' therebetween.

The second accommodation space 12' includes a third aperture 121', a fourth aperture 122' and a fifth aperture 124'. The fourth aperture 122' is above the fifth aperture 124'. The third aperture 121' is above the fourth aperture 122'.

A third sidewall 1211' surrounds or defines the third aperture 121'. The third aperture 121' has a third aperture size (e.g., diameter). A fourth sidewall 1221' surrounds or defines the fourth aperture 122'. The fourth aperture 122' has a fourth aperture size (e.g., diameter). A fifth sidewall 1241' surrounds or defines the fifth aperture 124'. The fifth aperture 124' has a fifth aperture size (e.g., diameter). The third aperture size is greater than the fourth aperture size, for example, at least approximately 1.05 times, 1.1 times, 1.2 times, or 1.3 times greater. The fifth aperture size is greater than the fourth aperture size, for example, at least approximately 1.05 times, 1.1 times, 1.2 times, or 1.3 times greater.

A bottom end of the third sidewall 1211' surrounding the third aperture 121' and a top end of the fourth sidewall 1221' surrounding the fourth aperture 122' meet at a second support portion 125' therebetween.

The housing 1' includes or defines a seventh aperture 126' below the fifth aperture 124' and the sixth aperture 114'. The optical sensor 7' is located in the seventh aperture 126'.

A seventh sidewall 1261' surrounds the seventh aperture 126'. The seventh sidewall 1261' is located below the fifth sidewall 1241' and the sixth sidewall 1141', and the seventh aperture 126' has a sixth aperture size (e.g., diameter). The seventh aperture size is greater than the sum of the fifth aperture size and the sixth aperture size, for example, at least approximately 1.05 times, 1.1 times, 1.2 times, or 1.3 times greater.

The seventh sidewall 1261' of the housing 1' may further include or define a first vent hole 113'. The first vent hole 113' laterally communicates with the seventh aperture 126' and an exterior of the housing 1'. In other words, fluid such as gas or liquid (not shown) may flow to the exterior of the housing 1' from the seventh aperture 126' by way of the first vent hole 113', and vice versa. The second sidewall 1121', the fourth sidewall 1221', the fifth sidewall 1241' or the sixth sidewall 1141' of the housing 1' may also further include or define a vent hole similar to the first vent hole 113', so that fluid such as gas or liquid (not shown) flowing in the second aperture 112', the fourth aperture 122', the fifth aperture 124', the sixth aperture 114' or the seventh aperture 126' may flow to the exterior of the housing 1 by way of the vent holes, and vice versa.

When the housing 1' is disposed over the substrate 5', the light-emitting component 6 and the optical sensor 7 are encircled by the housing 1'. The light-emitting component 6 is positioned in the sixth aperture 114' of the first accommodation space 11'. The optical sensor 7 is positioned in the seventh aperture 126'.

The first lens 31 is located in the first aperture 111' of the first accommodation space 11' and is supported by the first support portion 115'. The size of the first aperture size of the first aperture 111' is greater than a diameter of a bottom portion 313 of the first lens 31. Therefore, when the first lens 31 is supported on the first support portion 115', there is a gap between the bottom portion 313 of the first lens 31 and the first sidewall 1111'.

When the first lens 31 is disposed on the first support portion 115', the center (line or point) of a lens portion 311 is aligned with a geometric center of a light-emitting area of the light-emitting component 6, so that the optical module 100' can have improved luminous efficiency. Although the light-emitting component 6 has been fixed onto the optical sensor 7, an alignment action can still be carried out by adjusting a horizontal position of the first lens 31. The gap is available for adjusting the horizontal position of the first lens 31.

An edge of an inner wall 1121s' of the second sidewall 1121' can be used to serve as a positioning mark to carry out an alignment action with the center of the lens portion 311.

The second aperture size of the second aperture 112' is greater than a diameter of the lens portion 311 of the first lens 31, and thus, in the event that the first lens 31 is appropriately disposed in the first aperture 111', light emitted by the light-emitting component 6 located below the first lens 31 can be substantially completely provided through the lens portion 311, thereby further increasing the luminous efficiency.

The second lens 33 is located in the third aperture 121' of the second accommodation space 12' and is supported by the second support portion 125'. The third aperture size of the third aperture 121' is greater than a diameter of a bottom portion 333 of the second lens 33. Therefore, when the second lens 33 is supported on the second support portion 125', there is a gap between the bottom portion 333 of the second lens 33 and the third sidewall 1211'.

When the second lens 33 is disposed on the second support portion 125', a center (line or point) of the lens portion 331 is aligned with a photosensitive area (not shown) of the optical sensor 7, so that all or substantially all light entering into the third aperture 121' can reach the photosensitive area of the optical sensor 7.

As the optical sensor 7 has been fixed onto the substrate 5', an alignment action can be carried out by adjusting a horizontal position of the second lens 33. The gap is available for adjusting the horizontal position of the second lens 33.

An edge of an inner wall 1221s' of the fourth sidewall 1221' can serve as a positioning mark to carry out an alignment action with the center of the lens portion 331.

The fourth aperture size of the fourth aperture 122' is greater than a diameter of the lens portion 331 of the second lens 33, and thus, in the event that the second lens 33 is appropriately disposed in the third aperture 121', the optical sensor 7 located below the second lens 33 can substantially completely receive light transmitted through the lens portion 331, thereby increasing light receiving and sensing efficiency.

As the housing 1' has the first support portion 115' and the second support portion 125' which can bear the first lens 31 and the second lens 33 respectively, lenses made of a transparent packaging material (e.g., to cover the first lens 31 and the second lens 33) may be omitted, which also relatively reduces manufacturing complexity and cost.

After the first lens 31 and the second lens 33 are respectively fixed to the first support portion 115' and the second support portion 125', due to protection provided by the first lens 31 and the second lens 33 thereabove, it may be unnecessary to use a packaging material to respectively clad the light-emitting component 6 and the optical sensor 7. In other words, a packaging material may be omitted between the first lens 31 and the light-emitting component 6 or between the second lens 33 and the optical sensor 7. Air, but no packaging material, is in the second aperture 112', the fourth aperture 122', the fifth aperture 124', the sixth aperture 114' and the seventh aperture 126'.

The optical module 100' may be mounted to a system substrate or a printed circuit board in a subsequent stage or process. The mounting of the optical module 100' may be performed in a high temperature environment, for example, the temperature may be up to approximately 250° C. during reflow. At such temperatures, if not released, the air in the second aperture 112', the fourth aperture 122', the fifth aperture 124', the sixth aperture 114' and the seventh aperture 126' may, due to heating expansion, separate the first lens 31 and the second lens 33 respectively from the first support portion 115' and the second support portion 125'. As the optical module 100' has a first vent hole 113', the air in the second aperture 112', the fourth aperture 122', the fifth aperture 124', the sixth aperture 114' and the seventh aperture 126' may be released to the exterior of the housing 1' via the first vent hole 113', thereby avoiding separation of the first lens 31 or the second lens 33 from the housing 1' due to the heat expansion.

As the light-emitting component 6 is located on the optical sensor 7, the housing 1' and the substrate 5' have a smaller area as compared with the housing 1 and the substrate 5 of the optical module 100 shown in FIG. 2A. In other words, a volume of the optical module 100' may be less than that of the optical module 100.

Figure 5B:
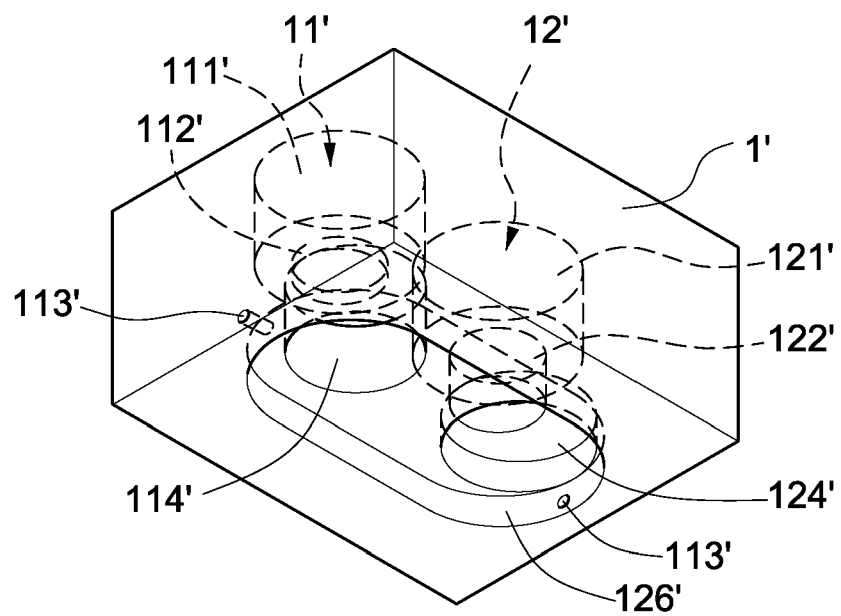
FIG. 5B is a three-dimensional perspective view of a housing according to another embodiment of the present disclosure.
Figure 5C:
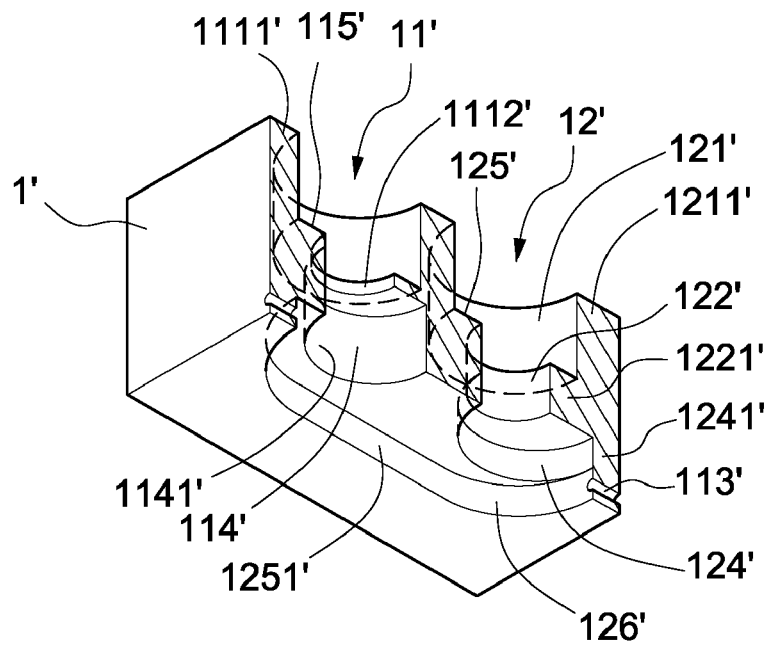
FIG. 5C is a sectional three-dimensional perspective view of a housing according to another embodiment of the present disclosure.

FIG. 5B is a three-dimensional perspective view of the housing 1' of FIG. 5A according to an embodiment of the present disclosure. FIG. 5C is a sectional three-dimensional perspective view of the housing of FIG. 5B according to an embodiment of the present disclosure. Referring to FIG. 5B and FIG. 5C, the housing 1' has the first accommodation space 11' and the second accommodation space 12'.

The first accommodation space 11' includes the first aperture 111', the second aperture 112' and the sixth aperture 114' vertically superimposed. The first aperture 111' is above the second aperture 112'. The second aperture 112' is above the sixth aperture 114'.

The first aperture 111' has the first aperture size (e.g., diameter) defined by the first sidewall 1111'. The second aperture 112' has the second aperture size (e.g., diameter) defined by the second sidewall 1121'. The first aperture size is greater than the second aperture size. The sixth aperture 114' has the sixth aperture size defined by the sixth sidewall 1141', and the sixth aperture size is greater than the second aperture size.

As the first aperture size of the first aperture 111' is greater than the second aperture size of the second aperture 112', the first support portion 115' is defined where a bottom of the first sidewall 1111' meets a top end of the second sidewall 1121'.

The second accommodation space 12' includes the third aperture 121', the fourth aperture 122' and the fifth aperture 124' vertically superimposed. The third aperture' 121 is above the fourth aperture 122'. The fourth aperture 122' is above the fifth aperture 124'.

The third aperture 121' has the third aperture size (e.g., diameter) defined by the third sidewall 1211'. The fourth aperture 122' has the fourth aperture size defined by a fourth sidewall 1221'. The third aperture size is greater than the fourth aperture size. The fifth aperture 124' has the fifth aperture size (e.g., diameter) defined by the fifth sidewall 1241'. The fifth aperture size is greater than the fourth aperture size.

As the third aperture size of the third aperture 121' is greater than the fourth aperture size of the fourth aperture 122', the second support portion 125' is defined where a bottom of the third sidewall 1211' meets a top end of the fourth sidewall 1221'.

The seventh aperture 126' is below the fifth aperture 124' and the sixth aperture 114'. The seventh sidewall 1261' surrounds the seventh aperture 126' to define a sixth aperture size (e.g., diameter). The seventh aperture size is greater than a sum of the fifth aperture size and the sixth aperture size.

FIG. 6A to FIG. 6E are schematic views of a method of making an optical module 100' according to another embodiment of the present disclosure.

Figure 6A:
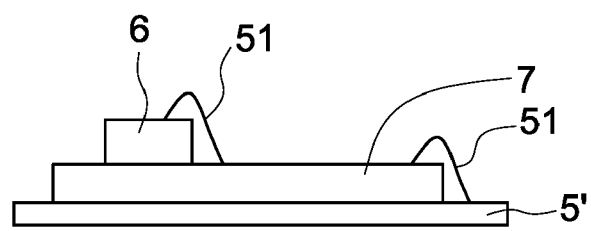
FIG. 6A, FIG. 6B, FIG. 6C, FIG. 6D and FIG. 6E are schematic views of a method of making an optical module according to another embodiment of the present disclosure.

Referring to FIG. 6A, a conductive or non-conductive adhesive may be used to fix an optical sensor 7 to an upper surface of a substrate 5' and fix a light-emitting component 6 to an upper surface of the optical sensor 7. One or more bonding wires 51 may be disposed to electrically connect the optical sensor 7 to a wire bond pad (not shown) located on the upper surface of the substrate 5' or to electrically connect the light-emitting component 6 to a wire bond pad (not shown) located on the upper surface of the optical sensor 7.

In another embodiment (not shown) of the present disclosure, the light-emitting component 6 and the optical sensor 7 may be flip-chip dies, and thus the light-emitting component 6 and the optical sensor 7 can be fixed onto the substrate 5 without the wire 51 by using, for example, solder.

Fiducial marks may be incorporated for position alignment, as described above.

Figure 6B:
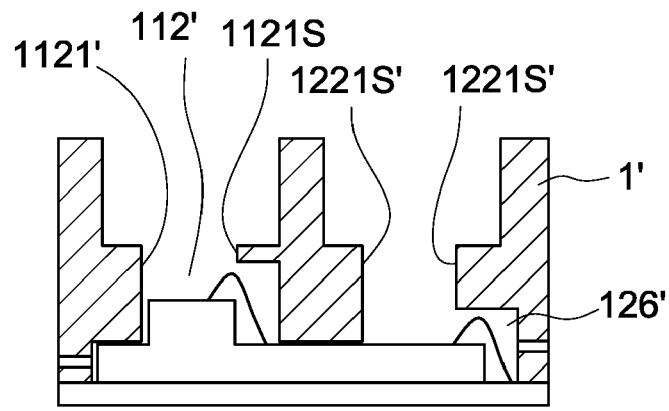

Referring to FIG. 6B, the housing 1' is fixed to a predetermined position of the substrate 5', so that the housing 1' can encircle the light-emitting component 6 and the optical sensor 7. The upper surface of the substrate 5' may include a fiducial mark (not shown) for positioning. The housing 1' may have a positioning design in which four sides protrude (not shown), to reduce shifting of the housing 1', when adhered to the substrate 5', due to mobility of an adhesive or in a process of baking and curing the adhesive. As described above, housings such as the housing 1' may be placed individually, or may be placed as a matrix of housings.

The housing 1' is fixed onto the substrate 5' such that the light-emitting component 6 is located in the second aperture 112' of the first accommodation space 11' of the housing 1', and the optical sensor 7 is located in the seventh aperture 126'.

Figure 6C:
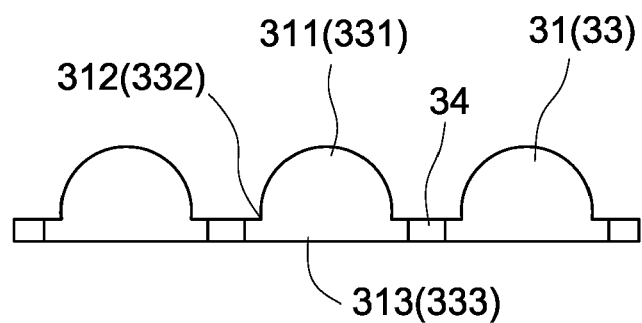

Referring to FIG. 6C, a lens array may include, but is not limited to, multiple lenses 31 (or multiple lenses 33, or multiple lenses 31 interspersed with multiple lenses 33)) and a connecting portion 34. A lens portion 311 (or 331) is in a spherical shape and presents a step-like structure in profile with an adjacent portion 312 (or 332) of a flow channel formed by using a die forming lens process. That is, a lens bottom portion 313 (or 333), when viewed from above, will present a high-brightness light ring, a circumferential center of the light ring is a geometric center line of the lens 31 (or 33), which can serve as an alignable mark of optical identification when the lens 31 (or 33) is subsequently fixed to the housing 1'.

Figure 6D:
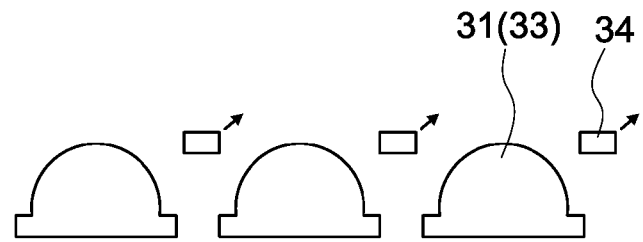

Referring to FIG. 6D, the connecting portion 34 is removed, for example, by cutting, to divide the lens array into multiple individual first lenses 31 and/or second lenses 33.

Figure 6E:
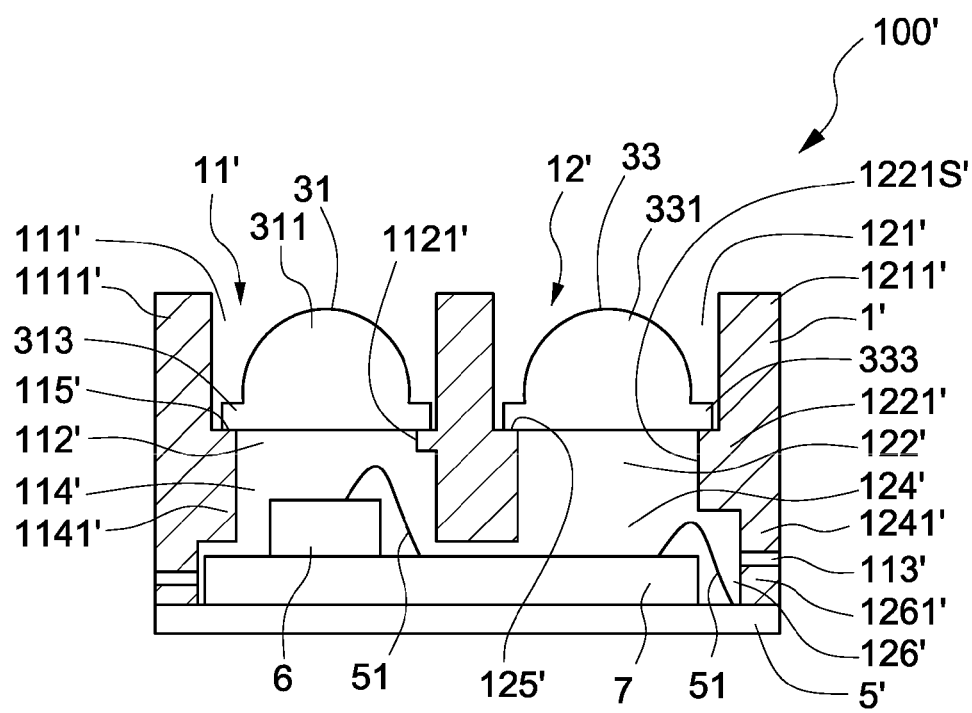

Referring to FIG. 6E, the first lens 31 and the second lens 33 are respectively fixed onto the first support portion 115' and the second support portion 125' of the housing 1'. An optical positioning system may be used, for example, to take the adjacent portion 312 (or 332) of the lens portion 311 (or 331) as an optical alignable mark, and use a pick and place machine to identify and capture the lens 31 (or 33), and place the first lens 31 and the second lens 33 respectively on the first support portion 115' and the second support portion 125' of the housing 1'.

The first aperture size of the first aperture 111' of the first accommodation space 11' is greater than a diameter of the lens bottom portion 313 of the first lens 31, so that there is a first gap between the first lens 31 and the first sidewall 1111'. As the size of the third aperture size of the third aperture 121' of the second accommodation space 12' is greater than a diameter of the lens bottom portion 333 of the second lens 33, there is a second gap between the second lens 33 and the third sidewall 1211'. While the first lens 31 is being affixed, the first lens 31 can move within the first gap to perform or complete positioning alignment. While the second lens 33 is being affixed, the second lens 33 can move within the second gap to perform or complete positioning alignment.

In one or more embodiments, to reduce an error in alignment positioning, a UV gel, a sticky film or a high-viscosity sticky gel is used to affix the first lens 31 and the second lenses 33 to the housing 1', to avoid a shift of the first lens 31 or the second lens 33 during hardening and baking of adhesive materials, or while being moved about.

Figure 7:
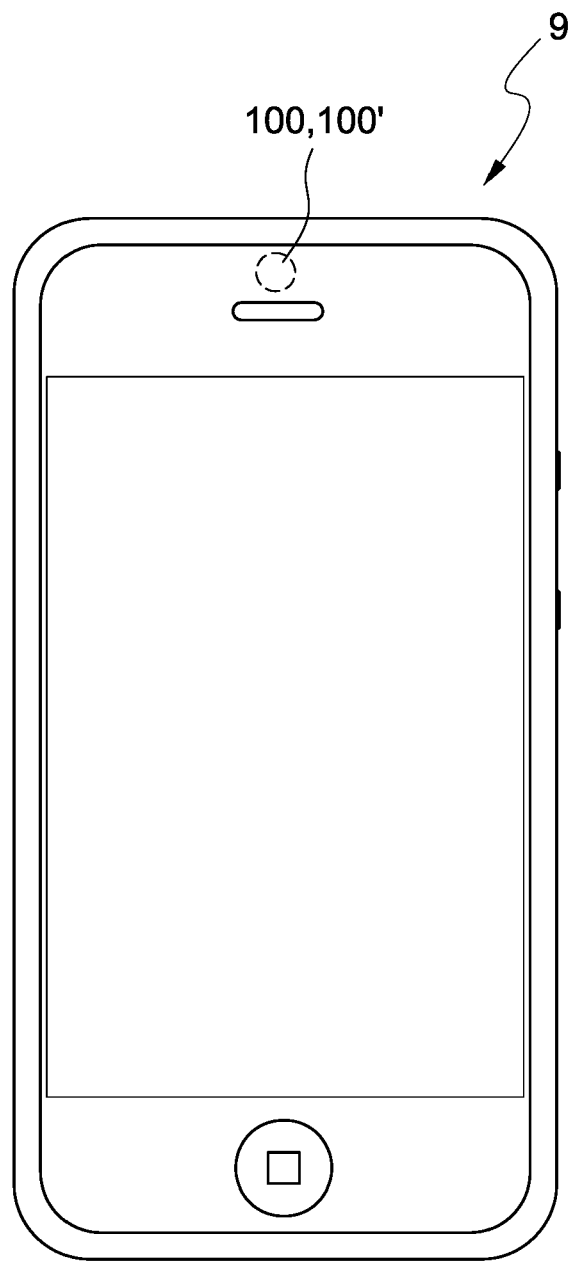
FIG. 7 is a schematic view of an electronic device including an optical module according to an embodiment of the present disclosure.

FIG. 7 is a schematic view of an electronic device including the optical module 100 or 100' in respective FIG. 1 or FIG. 4 according to an embodiment of the present disclosure. Referring to FIG. 7, the electronic device 9, for example, is, but is not limited to, a mobile electronic device or product such as a smartphone or a tablet computer. The electronic device 9 may include, but is not limited to, the optical module 100 or 100' shown in FIG. 1 or FIG. 4, and thus has better optical sensing efficacy than a conventional product.

As used herein, the terms "substantially," "substantial," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Similarly, the terms "substantially completely" or "substantially all" can encompass variation of less than or equal to ±10% of 100%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. An optical module, comprising:
   a carrier;
   a light-emitting component disposed over the carrier;
   an optical sensor disposed over the carrier;
   a housing disposed over the carrier and encircling the light-emitting component and the optical sensor, the housing defining a first accommodation space and a second accommodation space, the first accommodation space including a first aperture and a second aperture below the first aperture, the first aperture having a first aperture size, the second aperture having a second aperture size, the first aperture size greater than the second aperture size, the second accommodation space including a third aperture and a fourth aperture below the third aperture, the third aperture having a third aperture size, and the fourth aperture having a fourth aperture size, the housing comprising:
  a first sidewall surrounding the first aperture;
  a second sidewall surrounding the second aperture; and
  a first support portion where a bottom end of the first sidewall and a top end of the second sidewall meet;
  a first lens located in the first aperture and supported by the first support portion;
  a third sidewall surrounding the third aperture;
  a fourth sidewall surrounding the fourth aperture;
  a fifth sidewall located below the fourth sidewall and surrounding a fifth aperture, the fifth aperture having a fifth aperture size, the fifth aperture size greater than the fourth aperture size;
  a second support portion where a bottom end of the third sidewall and a top end of the fourth sidewall meet; and
  a second lens located in the third aperture and supported by the second support portion;
wherein one of the light-emitting component and the optical sensor is located in the second aperture of the first accommodation space, and the other one of the light-emitting component and the optical sensor is located in the second accommodation space.

2. The optical module according to claim 1, wherein the first lens has a bottom portion, and the first aperture size of the first aperture is greater than a diameter of the bottom portion of the first lens.

3. The optical module according to claim 1, the housing further defining a vent hole in communication with the second aperture.

4. The optical module according to claim 1, the housing further defining a vent hole in communication with the fourth aperture.

5. The optical module according to claim 1, wherein the second lens has a bottom portion, and the third aperture size of the third aperture is greater than a diameter of the bottom portion of the second lens.

6. The optical module according to claim 1, wherein the third aperture size is greater than the fourth aperture size.

7. The optical module according to claim 1, wherein the second lens has a lens portion, the fourth aperture size of the fourth aperture is greater than a diameter of the lens portion of the second lens.

8. The optical module according to claim 1, wherein the light-emitting component is aligned with the first accommodation space, and a sensing portion of the optical sensor is aligned with the second accommodation space.

9. The optical module according to claim 1, the housing further defining a second vent hole in communication with the fifth aperture.

10. The optical module according to claim 1, the housing further comprising a sixth sidewall located below the second sidewall and surrounding a sixth aperture, the sixth aperture has a sixth aperture size, the sixth aperture size greater than the second aperture size.

11. The optical module according to claim 10, the housing further defining a first vent hole in communication with the sixth aperture.

12. The optical module according to claim 10, the housing further comprising a seventh sidewall located below the fifth sidewall and the sixth sidewall and surrounding a seventh aperture, the seventh aperture having a seventh aperture size, and the seventh aperture size greater than a sum of the fifth aperture size and the sixth aperture size.

13. The optical module according to claim 12, the housing further defining a third vent hole in communication with the seventh aperture.

14. A method of making an optical module, comprising:
  (a) providing a substrate;
  (b) disposing a light-emitting component and an optical sensor over the substrate;
  (c) disposing a housing over the substrate, the housing defining a first accommodation space and a second accommodation space, the housing encircling the light-emitting component and the optical sensor:
  the first accommodation space including a first aperture and a second aperture below the first aperture, the first aperture having a first aperture size, the second aperture having a second aperture size, the first aperture size greater than the second aperture size, one of the light-emitting component and the optical sensor located in the second aperture of the first accommodation space,
  the second accommodation space including a third aperture and a fourth aperture below the third aperture, the third aperture having a third aperture size, the fourth aperture having a fourth aperture size, and the other one of the light-emitting component and the optical sensor located in the second accommodation space,
  the housing comprising:
    a first sidewall surrounding the first aperture;
    a second sidewall surrounding the second aperture; and
    a first support portion where a bottom end of the first sidewall and a top end of the second sidewall meet;
  the second accommodation space including a third aperture and a fourth aperture below the third aperture, the third aperture having a third aperture size, the fourth aperture having a fourth aperture size, and the third aperture size greater than the fourth aperture size, the housing further comprising:
  a third sidewall surrounding the third aperture;
  a fourth sidewall surrounding the fourth aperture; and
  a second support portion where a bottom end of the third sidewall and a top end of the fourth sidewall meet;
  a fifth sidewall located below the fourth sidewall and surrounding a fifth aperture, the fifth aperture having a fifth aperture size, the fifth aperture size greater than the fourth aperture size; and
  (d) positioning a first lens into the first aperture, supported by the first support portion, and positioning a second lens into the third aperture, supported by the second support portion.

15. The method according to claim 14, wherein the first lens has a bottom portion, and wherein the first aperture size of the first aperture is greater than a diameter of the bottom of the first lens.

16. The method according to claim 14, wherein the first lens has a lens portion, and wherein the second aperture size of the second aperture is greater than a diameter of the lens portion of the first lens.

17. The method according to claim 14, wherein the second lens has a bottom portion, and wherein the third aperture size of the third aperture is greater than a diameter of the bottom portion of the second lens.

18. The method according to claim 14, wherein the second lens has a lens portion, and wherein the fourth aperture size of the fourth aperture is greater than a diameter of the lens portion of the second lens.

19. An electronic device, comprising:
  an optical module, comprising:
    a carrier;
    a light-emitting component disposed over the carrier;

an optical sensor disposed over the carrier;
a housing disposed over the carrier encircling the light-emitting component and the optical sensor, the housing defining a first accommodation space and a second accommodation space, the first accommodation space comprising a first aperture and a second aperture below the first aperture, the first aperture having a first aperture size, the second aperture having a second aperture size, the first aperture size greater than the second aperture size, the second accommodation space including a third aperture and a fourth aperture below the third aperture, the third aperture having a third aperture size, and the fourth aperture having a fourth aperture size, the housing comprising:
    a first sidewall surrounding the first aperture;
    a second sidewall surrounding the second aperture; and
    a first support portion where a bottom end of the first sidewall meets a top end of the second sidewall;
    a first lens positioned in the first aperture and supported by the first support portion;
    a third sidewall surrounding the third aperture;
    a fourth sidewall surrounding the fourth aperture;
    a fifth sidewall located below the fourth sidewall and surrounding a fifth aperture, the fifth aperture having a fifth aperture size, the fifth aperture size greater than the fourth aperture size;
    a second support portion where a bottom end of the third sidewall and a top end of the fourth sidewall meet; and
    a second lens located in the third aperture and supported by the second support portion;
wherein one of the light-emitting component and the optical sensor is located in the second aperture of the first accommodation space, and the other one of the light-emitting component and the optical sensor is located in the second accommodation space.

20. The electronic device according to claim 19, wherein the first lens has a bottom portion, and wherein the first aperture size of the first aperture is greater than a diameter of the bottom portion of the first lens.

21. The electronic device according to claim 19, wherein the second lens has a bottom portion, and wherein the third aperture size of the third aperture is greater than a diameter of the bottom portion of the second lens.

22. The electronic device according to claim 19, wherein the third aperture size is greater than the fourth aperture size.

23. The electronic device according to claim 21, wherein the second lens has a lens portion, and wherein the fourth aperture size of the fourth aperture is greater than a diameter of the lens portion of the second lens.

24. The optical module according to claim 2, wherein a gap is disposed between the bottom portion of the first lens and the first sidewall.

\* \* \* \* \*